(12) United States Patent
Varadarajan et al.

(10) Patent No.: US 9,147,589 B2
(45) Date of Patent: Sep. 29, 2015

(54) SYSTEMS AND METHODS FOR AT LEAST PARTIALLY CONVERTING FILMS TO SILICON OXIDE AND/OR IMPROVING FILM QUALITY USING ULTRAVIOLET CURING IN STEAM AND DENSIFICATION OF FILMS USING UV CURING IN AMMONIA

(71) Applicant: Novellus Systems, Inc., San Jose, CA (US)

(72) Inventors: Bhadri N Varadarajan, Beaverton, OR (US); Bart Van Schravendijk, Sunnyvale, CA (US)

(73) Assignee: NOVELLUS SYSTEMS, INC., San Jose, CA (US)

(*) Notice: Subject to any disclaimer, the term of this patent is extended or adjusted under 35 U.S.C. 154(b) by 184 days.

(21) Appl. No.: 13/955,763

(22) Filed: Jul. 31, 2013

(65) Prior Publication Data

US 2014/0020259 A1    Jan. 23, 2014

Related U.S. Application Data

(62) Division of application No. 12/854,421, filed on Aug. 11, 2010, now Pat. No. 8,528,224.

(60) Provisional application No. 61/260,715, filed on Nov. 12, 2009.

(51) Int. Cl.
*F26B 3/34* (2006.01)
*H01L 21/67* (2006.01)
*H01L 21/02* (2006.01)

(52) U.S. Cl.
CPC ...... *H01L 21/67115* (2013.01); *H01L 21/0234* (2013.01); *H01L 21/02164* (2013.01); *H01L 21/02326* (2013.01); *H01L 21/02337* (2013.01); *H01L 21/02348* (2013.01)

(58) Field of Classification Search
CPC .............. F26B 3/00; F26B 3/34; F26B 19/00; F26B 21/00; F26B 21/04; H01L 21/00; H01L 21/02164
USPC ........ 34/279, 77, 78, 201, 210, 238; 438/714, 438/725; 134/706; 414/754; 118/500
See application file for complete search history.

(56) References Cited

U.S. PATENT DOCUMENTS 4,588,610 A    5/1986   Yamazaki
4,704,301 A   11/1987   Bauer et al.

(Continued)

FOREIGN PATENT DOCUMENTS

CN    1852772 A    10/2006
CN  101454886 A     6/2009

(Continued)

OTHER PUBLICATIONS

Translation of Notification of Reasons for Rejection for Japanese Patent Application No. 2010-244261, dated Nov. 11, 2014; 6 pages.

(Continued)

*Primary Examiner* — Stephen M Gravini

(57) ABSTRACT

A processing system includes a chamber and a steam source that supplies steam in the chamber. A UV source directs UV light onto a deposited layer of a substrate in the presence of the steam from the steam source for a predetermined conversion period to at least partially convert the deposited layer.

16 Claims, 7 Drawing Sheets

(56) References Cited

U.S. PATENT DOCUMENTS

| | | |
|---|---|---|
| 5,288,518 A | 2/1994 | Homma |
| 5,387,546 A | 2/1995 | Maega et al. |
| 5,840,600 A | 11/1998 | Yamazaki et al. |
| 6,035,548 A | 3/2000 | Rae |
| 6,614,181 B1 | 9/2003 | Harvey et al. |
| 6,663,723 B1 | 12/2003 | Templeton et al. |
| 6,911,084 B2 | 6/2005 | Kouvetakis et al. |
| 7,055,263 B2 | 6/2006 | Wu et al. |
| 7,148,155 B1 * | 12/2006 | Tarafdar et al. ............... 438/778 |
| 7,790,634 B2 | 9/2010 | Munro et al. |
| 8,173,537 B1 | 5/2012 | Chattopadhyay et al. |
| 8,236,706 B2 | 8/2012 | Peuse et al. .................. 438/770 |
| 8,304,351 B2 * | 11/2012 | Wang et al. .................... 438/761 |
| 8,528,224 B2 * | 9/2013 | Varadarajan et al. ........... 34/275 |
| 2002/0119327 A1 | 8/2002 | Arkles et al. |
| 2004/0018319 A1 | 1/2004 | Waldfried et al. |
| 2005/0156285 A1 | 7/2005 | Gates et al. |
| 2006/0046427 A1 | 3/2006 | Ingle et al. |
| 2006/0105106 A1 | 5/2006 | Balseanu et al. |
| 2006/0223315 A1 * | 10/2006 | Yokota et al. ................. 438/689 |
| 2007/0257205 A1 | 11/2007 | Rocha-Alvarez et al. |
| 2007/0281448 A1 | 12/2007 | Chen et al. ................... 438/478 |
| 2007/0281496 A1 | 12/2007 | Ingle et al. .................... 438/778 |
| 2009/0061647 A1 * | 3/2009 | Mallick et al. ................ 438/773 |
| 2009/0104791 A1 | 4/2009 | Nemani et al. ................ 438/788 |
| 2009/0305515 A1 | 12/2009 | Ho et al. |
| 2010/0043820 A1 | 2/2010 | Kawamura et al. ............ 134/1.1 |
| 2011/0256734 A1 | 10/2011 | Hausmann et al. |
| 2012/0036732 A1 | 2/2012 | Varadarajan et al. |

FOREIGN PATENT DOCUMENTS

| | | | |
|---|---|---|---|
| EP | 434153 A1 | 6/1991 | |
| EP | 517548 A2 | 12/1992 | |
| JP | 03082769 A | 4/1991 | .............. C32C 16/40 |
| JP | 5-259156 | 10/1993 | |
| JP | 5-343336 | 12/1993 | |
| JP | 8-55848 | 2/1996 | |
| JP | 08136904 A | 5/1996 | ............ G02F 1/1333 |
| JP | 08195494 A | 7/1996 | ............ H01L 29/786 |
| JP | 2003-168783 | 6/2003 | |
| JP | 2003168783 A | 6/2003 | |
| JP | 2003168783 A | 6/2003 | |
| JP | 2005203794 A | 7/2005 | |
| JP | 2006528426 A | 12/2006 | |
| JP | 2008091534 A | 4/2008 | |
| JP | 2009-41080 | 2/2009 | |
| JP | 2010171231 A | 8/2010 | |
| WO | WO2005/010971 | 2/2005 | |
| WO | WO2007/140376 | 12/2007 | |
| WO | WO 2007/140377 | * 12/2007 | |
| WO | WO2008/036810 | 3/2008 | |
| WO | WO-2010045595 A2 | 4/2010 | |

OTHER PUBLICATIONS

Translation of Notification of Examination Opinion for Japanese Patent Application No. 99138401, dated Dec. 23, 2014; 6 pages.

Matter. Res. Soc. Symp. Proc. vol. 863, 2005 Materials Research Society, B8.5.1; A Spin-On Dielectric Material for High Aspect Ratio Gap Fill; Wei Chen, Sheng Wang, Ather Ashraf, Edward Somerville, Gerard Nowaczyk, BK Hwang, JK Lee, and Eric S. Moyer, Dow Corning Corporation, Midland, MI 48686; Carlo Waldfried, Orlando Escocia and Qingyuan Han, Axcelis Technologies, Inc., Rockville, MD 20855; Apr. 19, 2005; 6 pages.

Microelectronic Engineering; www.elsevier.com/locate/mee; Application of VUV Irradiation to Promote the Wet Etch Resistance of PSZ-SOG Film Inside the Gap; Chia-Ming Chen, Ming-Hsin Yeh, Hung-Ju Chien, Jhen-Jhih Fan, Chin-Rung Yan, Hiroshi Matsuo; Powerchip Semiconductor Corporation, No. 12, Li-Hsin Rd. 1, Hsinchu Science Park, Hsinchu, Taiwan; Dec. 5, 2009; 5 pages.

Translation of the Notification of Examination Opinions received for Taiwan Patent Application No. 099138401 on Dec. 23, 2014, 5 pages.

* cited by examiner

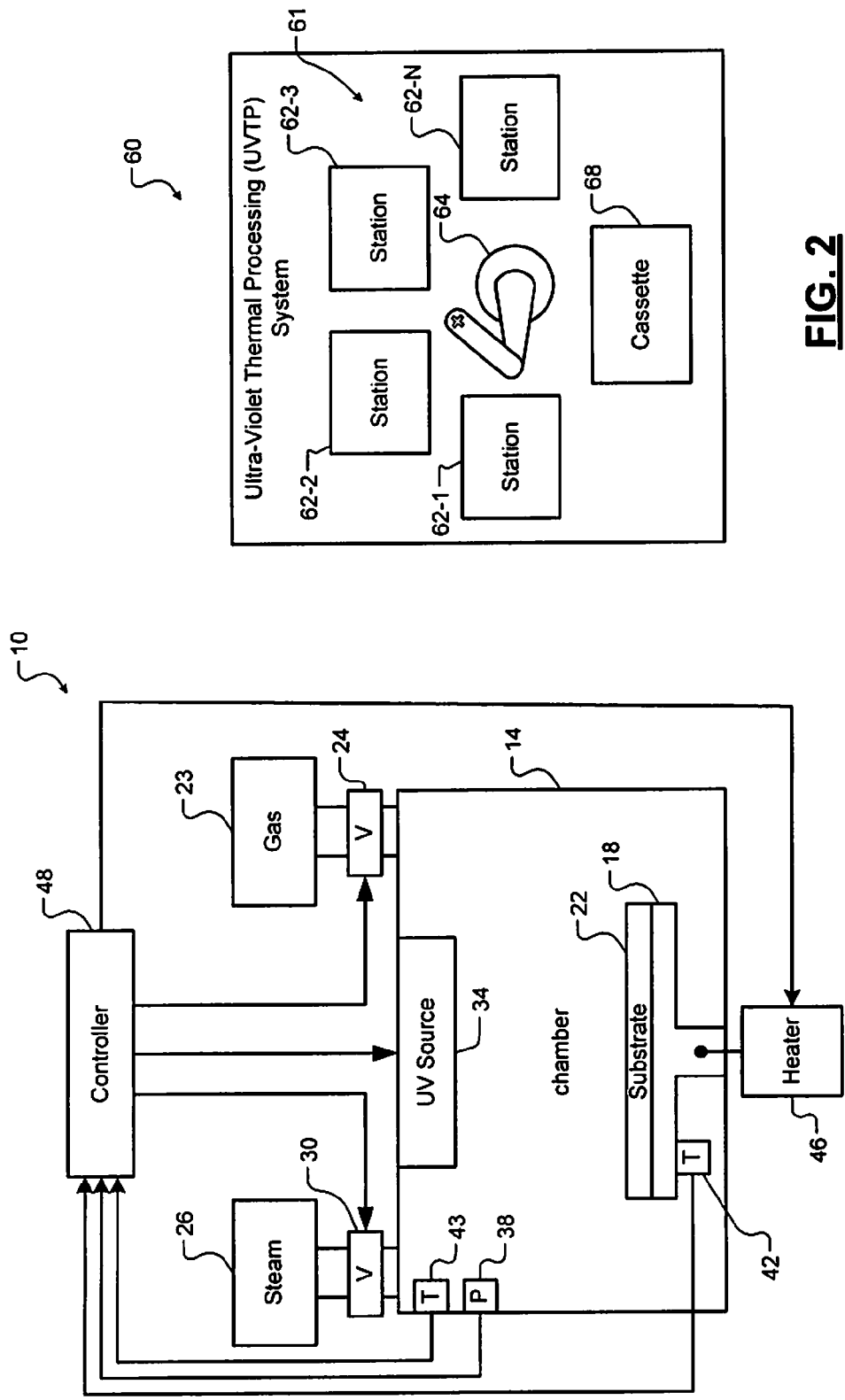

SYSTEMS AND METHODS FOR AT LEAST PARTIALLY CONVERTING FILMS TO SILICON OXIDE AND/OR IMPROVING FILM QUALITY USING ULTRAVIOLET CURING IN STEAM AND DENSIFICATION OF FILMS USING UV CURING IN AMMONIA

CROSS-REFERENCE TO RELATED APPLICATIONS

The present disclosure is a divisional of U.S. patent application Ser. No. 12/854,421 filed on Aug. 11, 2010. This application claims the benefit of U.S. Provisional Patent Application No. 61/260,715, filed Nov. 12, 2009. The entire disclosure of the applications referenced above, are incorporated herein by reference.

FIELD

The present disclosure relates to systems and methods for at least partially converting films to silicon oxide and/or improving film quality using UV curing in steam and for densifying films using UV curing in ammonia.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Many semiconductor processes require silicon oxide (such as SiO, $SiO_2$, $SiO_xH_y$) to be formed as a film or deposited layer on a substrate. Methods for forming silicon oxide may include chemical vapor deposition (CVD) (such as thermal or plasma enhanced CVD, high density plasma (HDP) CVD). However, some applications such as pre-metal dielectric (PMD), interlayer dielectric (ILD) or shallow trench isolation (STI) require high aspect ratio filling. As aspect ratios increase, filling gaps using these CVD approaches becomes more difficult.

Flowable materials such as flowable oxide, spin-on dielectric (SOD), spin-on glass (SOG) and/or spin-on polymer (SOP) may also be used. Flowable materials tend to have good gap-filling properties, which are suitable for high aspect ratio applications. After application, the deposited layer undergoes further processing to convert the deposited layer to a high density dielectric and/or to convert the deposited layer to silicon oxide. The flowable materials also generally need to have film properties that match HDP oxide (e.g., low wet etch rate ratio (WERR) (such as less than 1.2:1 or 1.5:1 compared to thermally grown $SiO_2$) and high density). For example only, the SOD may include polysilazanes (PSZs) and the SOG may include siloxanes, silsesquioxanes, and silazanes.

For STI applications with relatively high thermal budgets, conversion of the deposited layer may be done at high temperatures in an oxidizing atmosphere (typically oxygen or steam). When the oxidizing atmosphere is oxygen, thin crust-formation may occur and poor quality film usually resides below the thin crust layer. While steam tends to have improved oxidative and penetrative properties as compared to oxygen, oxidation of underlying silicon may occur in applications without a silicon nitride (SiN) liner. High temperatures in an oxidative atmosphere may not be used for certain applications having lower thermal budgets, which are generally specified by a period at a particular temperature. For example only, some PMD applications have thermal budgets of 400° C. or lower for a particular period.

Conversion of the deposited layer to a dense oxide at lower temperatures can be challenging. For example only, steam annealing at 400° C. or lower does not typically result in full conversion to oxide, even after long annealing periods such as 30 minutes. In addition, the quality of the oxide that is formed is usually not acceptable due to the presence of silanols (SiOH), and consequently the oxides have low density and high WERR.

Sub-atmospheric chemical vapor deposition (SACVD) processes may be used to deposit the oxide. Low temperature oxides may also be deposited using a variety of other techniques such as plasma enhanced CVD (PECVD), atomic layer deposition (ALD), and plasma enhanced ALD (PEALD). These approaches generally cannot fill reentrant structures adequately. These approaches may also have significant silanol content after conversion, high WERR and/or low density, which may require a high temperature annealing step that exceeds the thermal budget to fix.

Further processing may also be required after conversion to reduce silanols (SiOH) and/or to increase the density of the deposited layer. The process used to increase the density needs to be within the thermal budget of the application. One approach involves annealing the deposited layer at the highest temperature and longest period allowed by the thermal budget. For example for STI gap-fill applications, higher temperatures such as 700-800° C. for a particular period are allowed (but preferably not in an oxidizing atmosphere). In such a case, the deposited layer is annealed to drive out the silanols and further increase the density of the oxide. In applications where the thermal budget is 400-480° C. for a particular period, annealing has a very limited impact. Annealing can potentially lower the free OH in the deposited layer, but densification and silanol removal typically do not occur at these lower temperatures.

SUMMARY OF THE INVENTION

A method for processing a substrate comprises supplying steam in a chamber; arranging a substrate with a deposited layer that includes silicon in the chamber; and directing UV light onto the deposited layer in the presence of the steam for a predetermined conversion period to at least partially convert the deposited layer.

In other features, the method includes adjusting a partial pressure of the steam in the chamber to greater than 70% by volume of gas in the chamber during the predetermined conversion period. The method includes adjusting a partial pressure of the steam in the chamber to greater than 15% and less than 70% by volume of gas in the chamber during the predetermined conversion period. The method includes soaking the substrate in steam at a predetermined temperature for a predetermined soak period prior to the predetermined conversion period.

In other features, the method includes supplying diluent gas to the chamber to create a predetermined pressure in the chamber before supplying the steam in the chamber; after the predetermined pressure is reached, supplying the steam into the chamber; and arranging the substrate in the chamber one of before and after waiting a predetermined period sufficient to establish a predetermined partial pressure of steam.

In other features, the method includes supplying diluent gas and the steam in the chamber at the same time; adjusting flows of the steam and the diluent gas to establish a predetermined partial pressure of steam; and arranging the substrate in the chamber.

In other features, the method includes arranging the substrate on a pedestal in the chamber; and controlling a temperature of the pedestal during the predetermined conversion period.

In other features, the temperature of the pedestal is controlled such that a temperature of the substrate is less than 480° C. during the predetermined conversion period. The method includes increasing a density of the deposited layer after the predetermined conversion period in at least one of the chamber and another chamber. Increasing the density further comprises supplying ammonia in at least one of the chamber and another chamber; and directing UV light onto the deposited layer in the at least one of the chamber and the another chamber for a predetermined densification period in the presence of the ammonia.

In other features, increasing the density further comprises supplying diluent gas in at least one of the chamber and another chamber; and directing UV light onto the deposited layer in the at least one of the chamber and the another chamber for a predetermined densification period in the presence of the diluent gas.

In other features, increasing the density further comprises heating the deposited layer after the predetermined conversion period. The deposited layer is selected from a group consisting of flowable oxide, spin-on dielectric (SOD), spin-on glass (SOG) and/or spin-on polymer (SOP). The UV light comprises broadband UV light.

A processing system comprises a chamber and a steam source that supplies steam in the chamber. A UV source directs UV light onto a deposited layer of a substrate in the presence of the steam from the steam source for a predetermined conversion period to at least partially convert the deposited layer.

In other features, a partial pressure of the steam in the chamber is greater than 15% and less than 70% by volume of gas in the chamber during the predetermined conversion period. A partial pressure of the steam in the chamber is greater than 70% by volume of gas in the chamber during the predetermined conversion period. The substrate is soaked in steam for a predetermined soak period before the predetermined conversion period.

In other features, a diluent gas source supplies diluent gas to the chamber to create a predetermined pressure in the chamber before the steam source supplies the steam. The steam source introduces the steam into the chamber after the predetermined pressure is reached. The substrate is arranged in the chamber after a predetermined period corresponding to a desired partial pressure of steam.

In other features, a diluent gas source supplies diluent gas while the steam source supplies the steam. The diluent gas source adjusts a flow of the diluent gas and the steam source adjusts a flow of the steam to achieve a desired partial pressure of steam.

In other features, a heater heats a pedestal in the chamber during the predetermined conversion period. The heater heats the pedestal such that a temperature of the substrate is less than 480° C. A density of the substrate is increased after the predetermined conversion period.

In other features, an ammonia source supplies ammonia in one of the chamber and another chamber. The density of the substrate is increased by directing the UV light onto the deposited layer for a predetermined densification period in the presence of the ammonia.

In other features, a diluent gas source supplies the diluent gas in one of the chamber and another chamber. The density of the substrate is increased by directing UV light onto the deposited layer for a predetermined densification period in the diluent gas. The substrate is annealed to increase the density of the substrate. The deposited layer is selected from a group consisting of flowable oxide, spin-on dielectric (SOD), spin-on glass (SOG) and/or spin-on polymer (SOP). The UV source provides broadband UV light.

A method for densifying a deposited layer of a substrate comprises supplying ammonia in a chamber; arranging the substrate that includes the deposited layer in the chamber; and directing UV light onto the deposited layer in the presence of the ammonia for a predetermined conversion period to at least partially densify the deposited layer.

In other features, the method includes, prior to densifying the deposited layer, converting the deposited layer to silicon oxide using UV curing in steam in one of the chamber and another chamber.

In other features, the method includes, prior to densifying the deposited layer, supplying steam in one of the chamber and another chamber; arranging the substrate that includes the deposited layer in the one of the chamber and another chamber; and directing UV light onto the deposited layer in the presence of the steam for a predetermined conversion period to at least partially convert the deposited layer.

In other features, the method includes adjusting a partial pressure of the steam in the one of the chamber and another chamber to greater than 70% by volume of gas in the chamber during the predetermined conversion period. The method includes adjusting a partial pressure of the steam in the one of the chamber and another chamber to greater than 15% and less than 70% by volume of gas in the chamber during the predetermined conversion period.

In other features, the method includes soaking the substrate in the steam for a predetermined soak period before the predetermined conversion period. The deposited layer is selected from a group consisting of flowable oxide, spin-on dielectric (SOD), spin-on glass (SOG) and/or spin-on polymer (SOP). The UV light comprises broadband UV light.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 1 is a functional block diagram of a chamber for converting a deposited layer using UV curing in steam according to the present disclosure;

FIG. 2 is a functional block diagram illustrating a system including a chamber with multiple stations for performing UV curing in steam according to the present disclosure;

DESCRIPTION

Figure 3A:
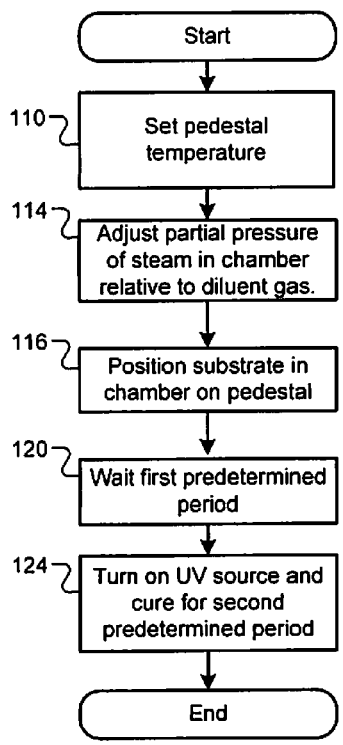
FIGS. 3A and 3B illustrate methods for converting a deposited layer using UV curing in steam according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

The present disclosure describes systems and methods for at least partially converting a deposited layer to silicon oxide and/or improving film quality using UV curing in steam. The present disclosure also relates to systems and methods for densifying a deposited layer using UV curing in ammonia. The densification of the deposited layer as described herein may be performed after partial conversion of the deposited layer to silicon oxide. Alternately, the densification of the deposited layer may be performed on any deposited layer. In other words, the conversion and densification approaches can be used together or independently of one another. As used herein, the term silicon oxide refers to silicon oxide (SiO), silicon dioxide ($SiO_2$), silanol ($SiO_xH_y$) and other compounds including (SiO). The conversion of the deposited layer tends to maximize crust formation and to improve film quality. Further improvements in film quality and density may be provided by the densification approaches described herein.

Referring now to FIG. 1, a semiconductor processing system 10 is shown to include a chamber 14 for converting a deposited layer to silicon oxide using UV curing in steam. For example only, the deposited layer may comprise a flowable material including silicon. The semiconductor processing system 10 further includes a pedestal 18 arranged inside the chamber 14. A substrate 22 may be arranged on the pedestal 18. The substrate 22 may comprise a deposited layer formed on one side. For example only, the substrate 22 may comprise a semiconductor substrate.

A gas source 23 of one or more diluent gases may be connected to the chamber 14 via one or more valves 24 and conduits. The diluent gas may comprise an inert gas, a non-reactive gas and/or other type gas. For example only, suitable diluent gases include Helium, Argon and Oxygen, although other diluent gases may be used. A steam source 26 may be connected to the chamber 14 via one or more valves 30 and conduits. The UV source 34 is arranged in the chamber 14 to provide broadband UV light and/or UV light at a single wavelength. The intensity of the UV source 34 may be varied as percentage of a maximum output level.

For example only, the UV source 34 may provide broadband UV light between 200 nm and 280 nm, although other UV ranges may be used. For example only, one suitable UV source may have a maximum output level of 800 $mW/cm^2$ from 185-400 nm and the intensity of the UV source may be varied between 0% and 100% of the maximum power output level, although other maximum output levels and intensity ranges may be used. Another suitable UV source may have a maximum output level of 800 $mW/cm^2$ from 200-280 nm and the intensity of the UV source may be varied between 35% and 100% of the maximum power output level, although other maximum output levels and intensity ranges may be used. Another suitable UV source may output energy at one or more wavelengths such as 172 nm, 222 nm or other wavelength values. Another suitable UV source may include a mercury lamp that outputs broadband UV light with peaks at one or more wavelengths. As can be appreciated, one or more UV filters may be used to select one or more wavelengths or wavelength ranges.

The UV source 34 directs UV light at the deposited layer of the substrate 22. One or more sensors may be arranged inside the chamber 14 to monitor operating conditions therein. For example only, a pressure sensor 38 and a temperature sensor 42 may be arranged inside the chamber 14 to monitor pressure and temperature in the chamber 14. The temperature sensor 42 may be arranged in close proximity or in contact with the pedestal 18 to monitor the temperature of the pedestal 18. An additional sensor 43 may be used to monitor a temperature of the substrate 22. For example only, the sensor 43 may comprise an infrared sensor. The sensors 42 and 43 monitor temperature differences between the pedestal 18 and the substrate 22.

A heater 46 may be provided to adjust a temperature of the pedestal 18. A controller 48 communicates with the heater 46, the valves 24 and 30, the pressure sensor 38, and the temperature sensor 42. The controller 48 may execute a control program to operate the heater 46 and/or the valves 24 and 30. The controller 48 may also communicate with a robot to position the substrate 22 in the chamber 14 and to move the substrate 22 to a cassette, another station or another chamber as needed.

Referring now to FIG. 2, a semiconductor processing system 60 includes a chamber 61. The chamber 61 may include one or more stations 62-1, 62-2, 62-3, . . . , and 62-N (collectively stations 62), where N is an integer greater than zero. While the chamber 61 is shown with multiple stations, multiple chambers or a single station chamber can also be used. Some of the stations or chambers may not have a UV light source.

A robot 64 may be used to retrieve substrates 22 from a cassette 68, to move the substrates 22 to/from the stations 62 and to return the substrates 22 to the cassette 68 after at least partial conversion, film quality improvement, and/or densification described herein. As can be appreciated, the substrates 22 may be moved through each of the stations 62. In some implementations, the stations 62 of the chamber 61 may be operated at the same or different temperature and UV intensity conditions and with the same or different gas and pressure conditions. When multiple chambers are used, the temperature, UV intensity, gas and pressure conditions can be different for each chamber. In some implementations, the semiconductor processing system may comprise a SOLA® UV Thermal Processing (UVTP) system available from Novellus Systems, Inc., although other semiconductor processing systems may be used.

Figure 3B:
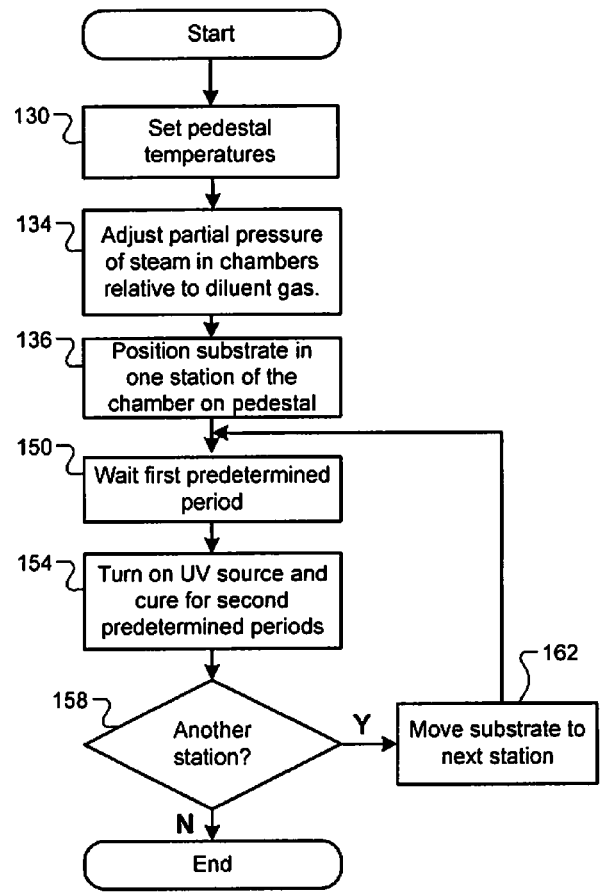

Referring now to FIGS. 3A and 3B, a method for converting a deposited layer using UV curing in steam according to the present disclosure is shown. In FIG. 3A, control begins at 110 where the temperature of the pedestal 18 is set to a predetermined temperature. For example only, the temperature of the pedestal 18 may be set less than the thermal budget limit of the application. In some implementations, the thermal budget is less than or equal to 480° C. for a particular period. In other implementations, the thermal budget is less than or equal to 400° C. for a particular period.

At 114, the partial pressure of steam in the chamber 14 is adjusted relative to the diluent gas. For example only, the desired partial pressure of steam may be created as follows.

The diluent gas may be introduced initially and the desired pressure may be established. For example only, the pressure may be set between 0 and 700 Torr, however other pressures may be used. In some implementations, a pressure value of 50 Torr may be used.

Then, the diluent gas may be turned off and the steam may be introduced for a predetermined period. Varying the predetermined wait period before introducing the substrate 22 in the chamber 14 after turning off the diluent gas and introducing steam will tend to vary the partial pressure conditions. In other systems, steam and diluent gas can be introduced at the same time and one or both can be adjusted until the wafer is processed.

For example only and as a rough estimate, low partial pressure may correspond to the predetermined wait period being around 5 minutes or less, medium partial pressure of steam may correspond to the predetermined wait period being around 10 minutes, and high partial pressure of steam may correspond to the predetermined wait period being around 15 minutes. As can be appreciated, the wait periods will depend on the particular implementation details.

For example only, introducing the substrate 22 to the chamber 14 at a low partial pressure will convert PSZ film to SiN. Whereas, introducing the substrate 22 to the chamber 14 at medium partial pressures will partially convert PSZ film to SiOH. Introducing the substrate 22 to the chamber 14 at high partial pressures will fully convert the PSZ film to $SiO_2$. In some implementations, the substrate 22 may be positioned in the chamber before the partial pressure is adjusted or before a desired partial pressure is reached.

In this example, low partial pressures correspond to partial pressures of less than 15% steam. Medium partial pressures correspond to partial pressures of greater than 15% and less than 70% steam. High partial pressures correspond to partial pressures greater than 70% steam. As can be appreciated, other semiconductor processing systems may allow direct control of the partial pressures.

When the desired partial pressure of steam is reached in the chamber 14, the substrate 22 can be positioned in the chamber 14 on the pedestal 18 at 116. In some implementations, the substrate 22 can be positioned in the chamber 14 before the desired partial pressure is adjusted or reached. At 120, the substrate 22 is allowed to soak or cure (steam anneal) in the steam for a predetermined period. At 124, after the predetermined period, the UV source 34 is turned on and the substrate 22 is UV cured in steam for a second predetermined period.

In FIG. 3B, the semiconductor processing system may include more than one chamber 14. A method begins at 130 where the temperatures of the pedestals 18 are set to one or more predetermined temperatures. The pedestal temperatures can be the same or different in the stations of the chamber 14. At 134, the partial pressure of steam in the chamber 14 is adjusted relative to the diluent gas. When the desired partial pressure is reached in the chamber 14, the substrate 22 can be positioned in one of the stations of the chamber 14 on the pedestal 18 at 116. As can be appreciated, the substrate may be arranged in the chamber before the partial pressure is adjusted or before a desired partial pressure is reached. At 120, the substrate 22 is allowed to soak or cure (steam anneal) in the steam for a predetermined period. At 124, after the predetermined period, the UV source 34 is turned on and the substrate is UV cured in steam for a second predetermined period.

At 128, the method determines whether the substrate 22 needs to be moved to another station of the chamber 14. If 128 is true, the substrate 22 is moved to another station of the chamber 14 at 132 and the method continues at 120. If 128 is false, the method ends. While the method in FIG. 3B relates to movement of one substrate 22 from one station of the chamber 14 to another, multiple substrates 22 can be processed and then moved in a pipeline fashion. Alternatively, multiple chambers or a single station chamber can be used.

In one exemplary implementation, multiple substrates can be processed in one chamber 14 with multiple stations. UV intensity and temperature can be controlled for each of the substrates. The substrates may have common or different gas conditions when the substrates are in different stations of the same chamber. Alternately, each of the substrates may have different gas conditions. The pedestal temperatures may be set to 300° C. The first station is used to soak the substrate without UV curing. The second, third and fourth stations have UV intensity settings at 35%, 35% and 35% of the maximum intensity, respectively. The substrates are processed for 5 minutes in each station.

In another exemplary implementation, the pedestal temperatures are set to 300° C. The first station is used to soak the substrate with no UV curing. The second, third and fourth stations have UV intensity settings at 35%, 50% and 75% of the maximum intensity. The substrates are processed in each station for 4 minutes.

In yet another exemplary implementation, the pedestal temperatures are set to 300° C. The first station is used to soak the substrate with no UV curing. The second, third and fourth stations have UV intensity settings at 100%, 100% and 100% of the maximum intensity. The substrates are positioned in each station for 2-3 minutes. As can be appreciated, the UV intensity, curing times, number of stations or chambers, pedestal temperatures, pressures and/or other parameters may be varied for a particular application.

Figure 4:
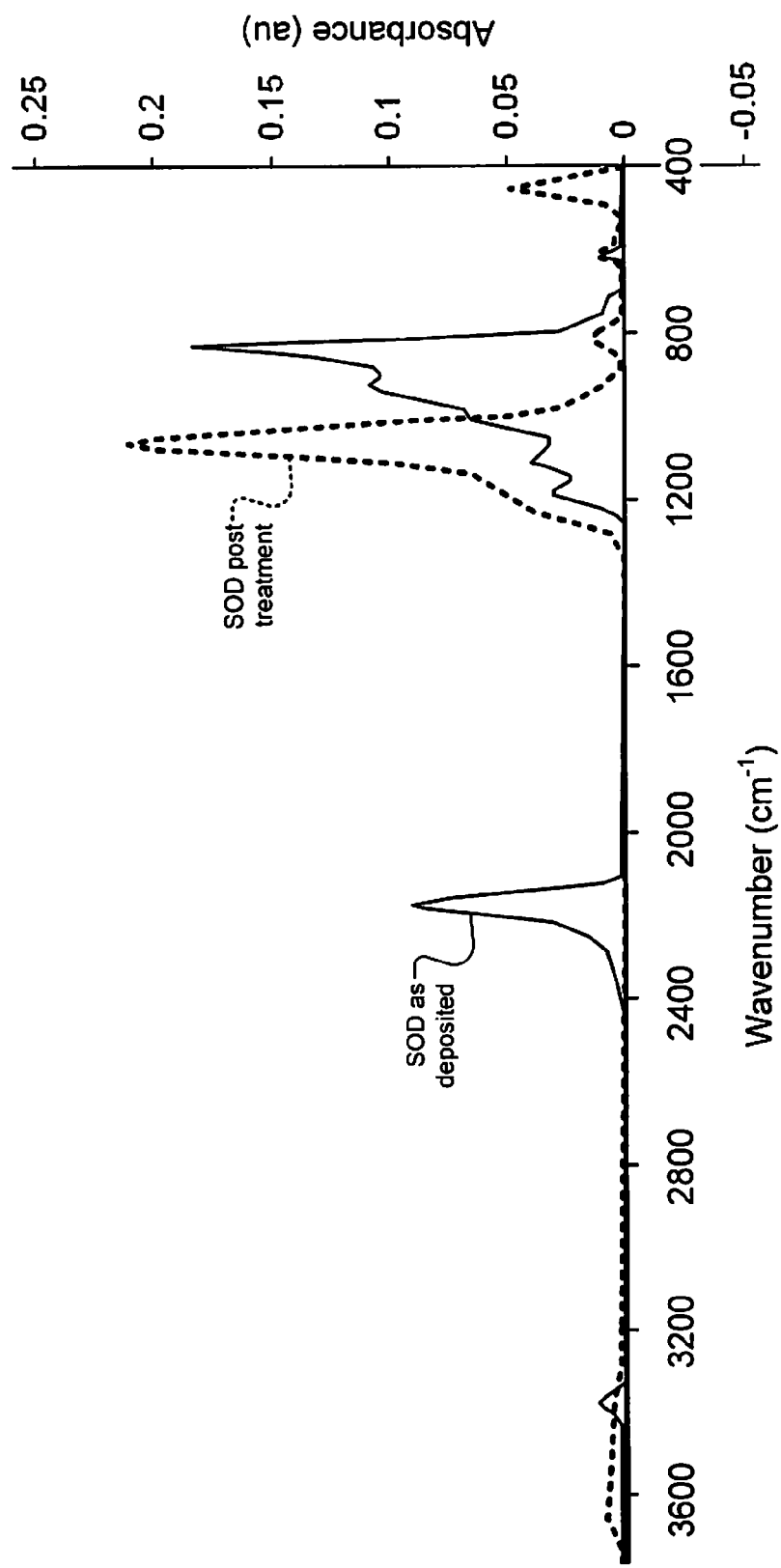
FIG. 4 is a graph showing results of Fourier Transform infrared spectroscopy (FTIR) for SOD after UV curing in steam according to the present disclosure.

Referring now to FIG. 4, a graph shows the results of Fourier Transform infrared spectroscopy (FTIR) for SOD after UV curing in steam according to the present disclosure. The SOD as deposited shows relatively high concentrations of Si—H bonds (2000-2260 $cm^{-1}$) and partial Si—N bonds (820-1020 $cm^{-1}$). After UV curing in steam, the Si—H and partial Si—N bonds are substantially converted to Si—O bonds (1066 $cm^{-1}$). In this implementation, the substrate was allowed to soak in the steam for a soak period prior to UV curing in steam.

Figure 5:
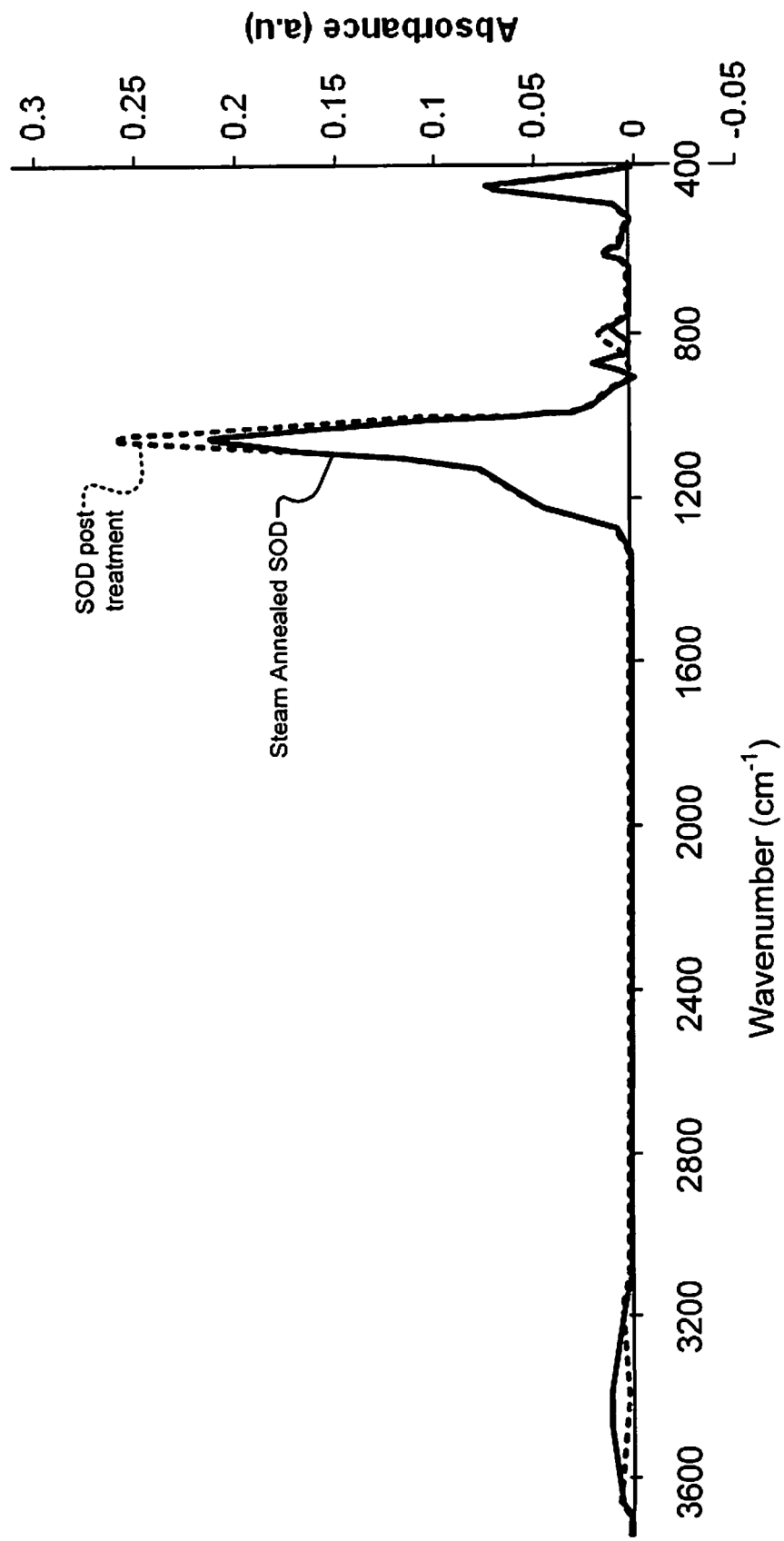
FIG. 5 is a graph showing results of FTIR for a steam annealed SOD after UV curing in steam according to the present disclosure.

Referring now to FIG. 5, a graph shows the results of FTIR for a steam annealed SOD after UV curing in steam according to the present disclosure. After UV curing in steam, the Si—H and partial Si—N bonds are further converted to Si—O bonds (1066 $cm^{-1}$) by the UV curing in steam. In this implementation, the substrate was allowed to cure in the steam for a cure period (longer than the soak period) prior to UV curing in steam.

Figure 6:
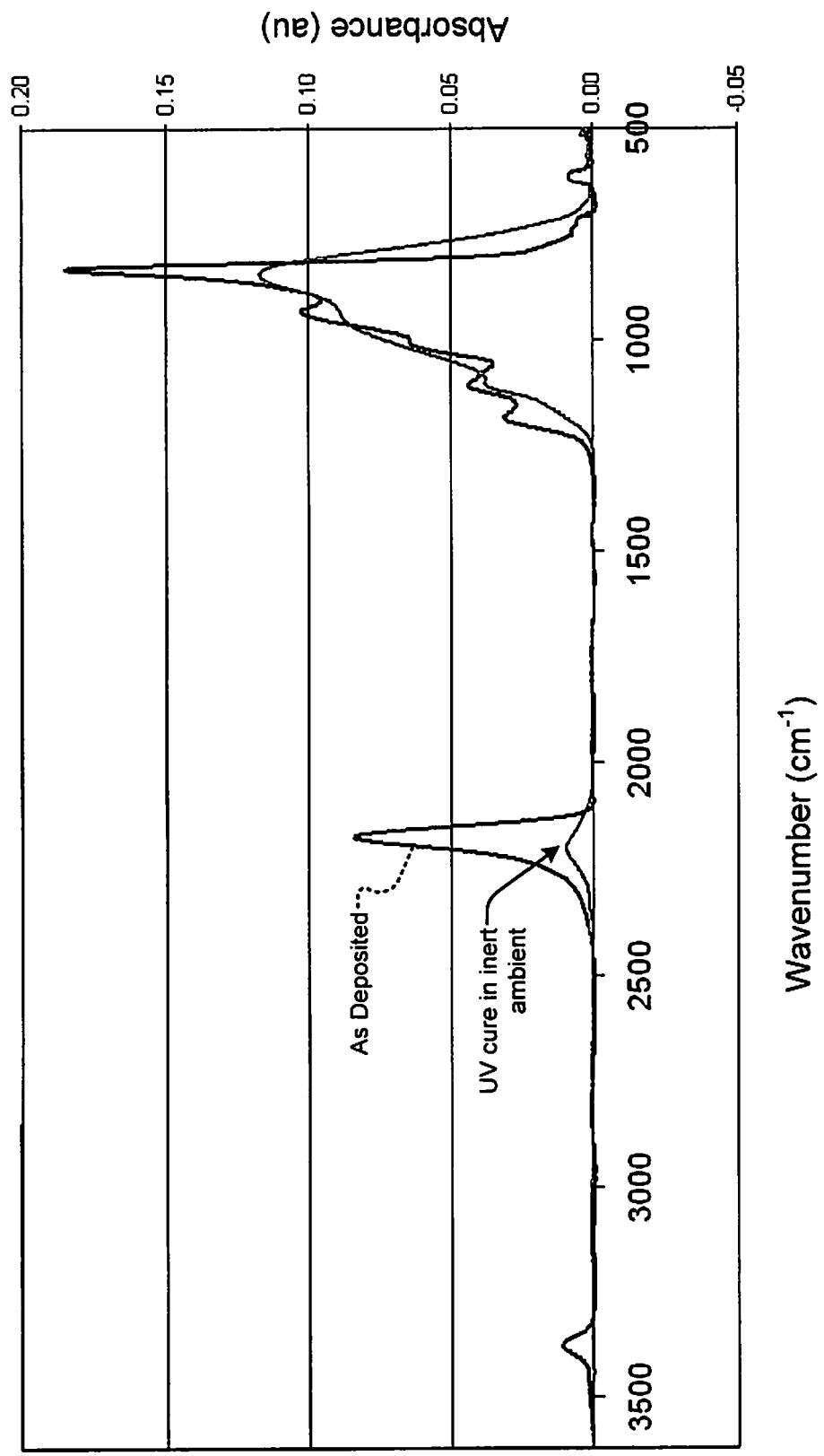
FIG. 6 is a graph showing results of FTIR after curing of SOD in inert ambient.

Referring now to FIG. 6, a graph shows results of FTIR after curing of SOD in inert ambient. The SOD as deposited shows relatively high concentrations of Si—H bonds (2000-2260 $cm^{-1}$) and partial Si—N bonds (820-1020 $cm^{-1}$). After UV curing, the Si—H bonds are reduced to a lesser extent than would be accomplished by UV curing in steam. The partial Si—N bonds are increased and Si—O conversion does not occur.

Figure 7A:
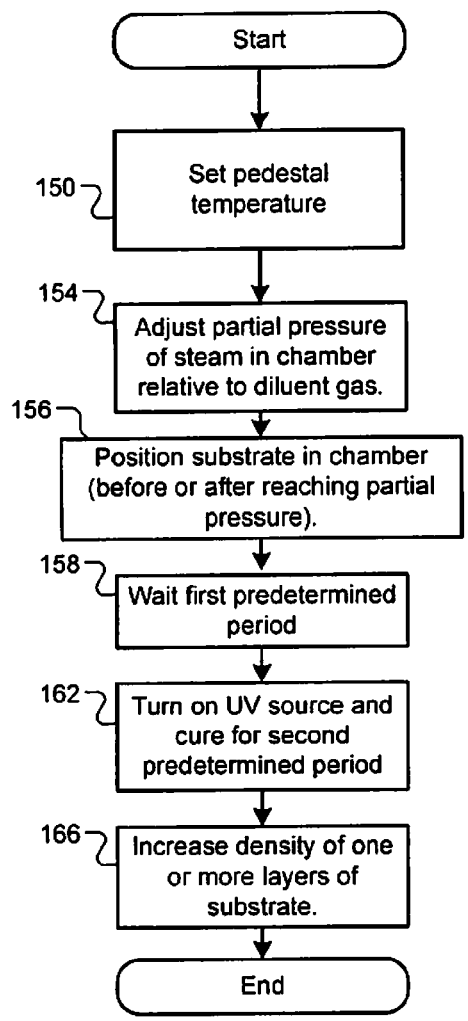
FIGS. 7A and 7B illustrate methods for converting the deposited layer using UV curing in steam followed by densification according to the present disclosure.
Figure 7B:
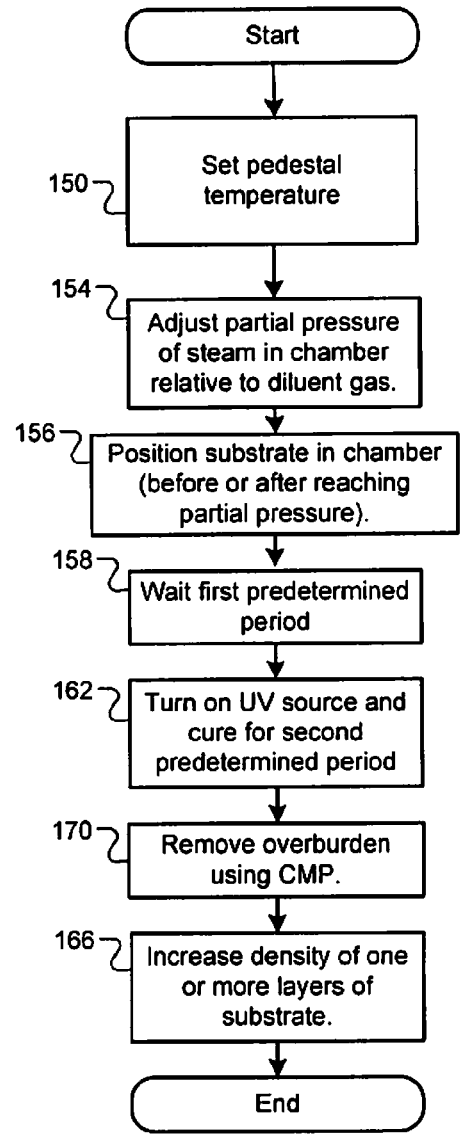

Referring now to FIGS. 7A and 7B, a method for converting the deposited layer using UV curing in steam followed by densification of the oxide according to the present disclosure is shown. In FIG. 7A, the pedestal temperature is set at 150. At 154, the partial pressure of steam in the chamber 14 is set relative to the diluent gas. At 156, the substrate 22 is positioned in the chamber 14. As can be appreciated the substrate may be positioned in the chamber before adjusting the partial pressure or before a desired partial pressure is reached. At 158, the method waits a first predetermined period. At 162, the method turns on the UV source 34 and cures for a second predetermined period. At 166, the method increases a density of the substrate.

The density of the substrate 22 may be increased using any suitable approach. For example only, the density of the substrate may be increased using annealing in a diluent gas such as Argon. Alternatively, the density of the substrate 22 may be increased using further UV curing in steam, ammonia or helium. When ammonia is used, the chamber may be pressurized between 1 and 600 Torr with or without other gases. For example only, 50 Torr and 600 Torr may be used without other gases. In other implementations, the chamber may be operated at higher pressures above 600 Torr, at atmospheric pressure or higher than atmospheric pressures (e.g. >760 Torr).

In FIG. 7B, steps that are similar to those in FIG. 7A are performed. Prior to increasing the density of one or more layers of the substrate at 166, a processing step may be performed to remove overburden at 170. For example, chemical mechanical polishing (CMP) may be performed to remove the overburden and to planarize a top surface of the substrate 22.

Figure 8B:
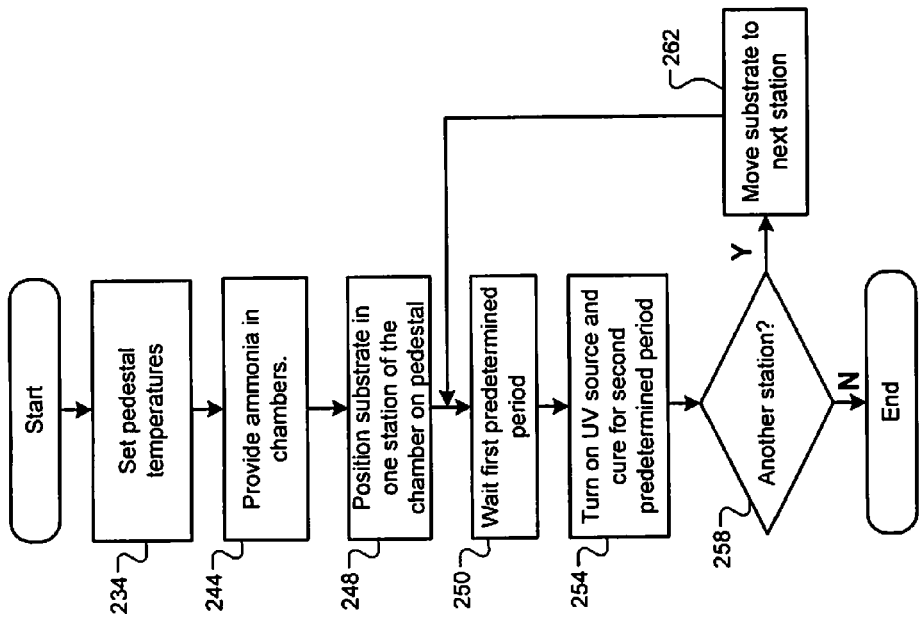
FIGS. 8A and 8B illustrate methods for densification using UV curing in ammonia according to the present disclosure.
Figure 8A:
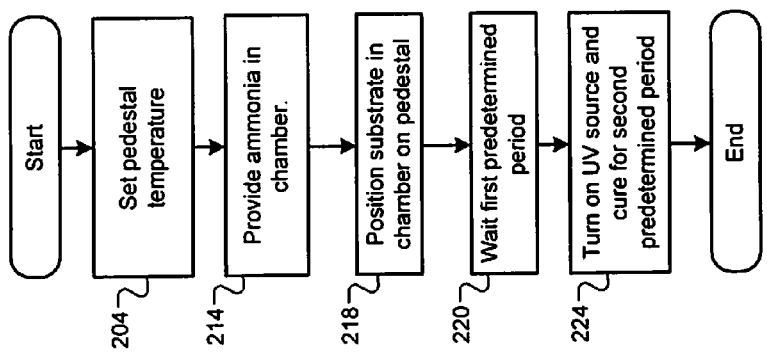

Referring now to FIGS. 8A and 8B, methods for densification using UV curing in ammonia according to the present disclosure are shown. In FIG. 8A, the method begins at 204 where the pedestal temperature is set. At 214, ammonia is provided in the chamber 14. At 218, the substrate 22 is positioned on the pedestal 18 in the chamber 14. At 220, the method waits a first predetermined period to allow soaking. At 224, the UV source 34 is turned on and the substrate is cured for a second predetermined period.

In FIG. 8B, the method begins at 234 where the pedestal temperatures for stations of the chamber 14 are set. At 244, ammonia is provided in the chamber 14. At 248, the substrate 22 is positioned on the pedestal 18 in one station of the chamber 14. At 250, the method may wait a first predetermined period. At 254, the UV source 34 is turned on and the substrate 22 is cured for a second predetermined period. After the second predetermined period, the method determines whether the substrate needs to be moved to another station of the chamber 14 at 258. If 258 is true, the method moves the substrate 22 to the next station of the chamber 14 at 262. Otherwise the method ends.

In one exemplary implementation, a chamber 14 with four stations may be used. The pedestal temperatures are set to 300° C., 330° C., 370° C. and 400° C. The first, second, third and fourth stations of the chambers 14 have UV intensity settings set at 100%. The substrate 22 is positioned in each of the chambers 14 for 7.5 minutes.

While ammonia is used in the above examples, other photoactive chemicals either alone or in combination with other chemical species present in the processing chamber may be used. Suitable examples of agents include $NH_3$, or $NH_3$-like compounds, wherein the H is replaced by deuterium (e.g., $NH_2D$, $NHD_2$, $ND_3$), $H_2$; hydrazine ($N_2H_4$), or other photoreactive gases that can produce a H— radical such as tetramethylsilane (4MS) or trimethylsilane (3MS), amines (e.g., methyl-, dimethyl- or trimethyl-amine, or ethylamine), alkenes such as ethylene or propylene, or alkynes such as acetylene, or combinations of these with one another and/or inert gases such as He, $N_2$ or Ar. In specific examples, the reducing gas may be $NH_3$ or $H_2$. A specific example is $NH_3$. Along with the UV light interacting with these photo active chemicals and helping in densification, the UV light in an ambient that is not steam also helps in densifying the film.

Additional methods for densification (in addition to the above UV in a non-steam environment or in addition to it) may be used. For example only, the deposited layer may be exposed to high density plasma (HDP). The HDP may include oxidizing $O_2$ plasma. However, the HDP may also include He, Ar, $H_2$ or $N_2$. The HDP may be run with or without a radio frequency (RF) bias on the pedestal, which may affect the depth of densification. Other examples include using UV curing in $O_2$. The UV curing in $O_2$ may be performed at atmospheric pressure, above atmospheric pressure, or below atmospheric pressure. For example only, the UV cure may be performed at 1 T to 700 T (below atmospheric pressure). Higher pressures (such as 600 T) may tend to promote oxygen radicals and creation of ozone as compared to lower pressures. Another example includes exposing the deposited layer to a remote plasma source of $O_2$, which produces oxygen radicals that help densify the deposited layer. Another example includes annealing at temperatures that approach (but are still below) the thermal budget of the process. The annealing may be performed in an inert gas such as $N_2$, He, $O_2$ or $H_2O$. Still another example uses $H_2$ or $NH_3$ to produce H radicals to help in densification.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A processing system, comprising:
    a chamber;
    a steam source that supplies steam in the chamber; and
    a UV source that directs UV light onto a previously deposited layer of a substrate in the presence of the steam from the steam source, wherein the previously deposited layer includes a flowable oxide, a spin-on dielectric (SOD), a spin-on glass (SOG), and/or a spin-on polymer (SOP), and wherein the UV source is configured to direct the UV light onto the previously deposited layer in the presence of the steam for a predetermined conversion period to at least partially convert the previously deposited layer from the flowable oxide, the SOD, the SOG, and/or the SOP into a silicon oxide.

2. The processing system of claim 1, wherein a partial pressure of the steam in the chamber is greater than 15% and less than 70% by volume of gas in the chamber during the predetermined conversion period.

3. The processing system of claim 1, wherein a partial pressure of the steam in the chamber is greater than 70% by volume of gas in the chamber during the predetermined conversion period.

4. The processing system of claim 1, wherein the substrate is soaked in steam for a predetermined soak period before the predetermined conversion period.

5. The processing system of claim 1, further comprising:
    a diluent gas source to supply diluent gas,
    wherein the diluent gas source supplies the diluent gas to the chamber to create a predetermined pressure in the chamber before the steam source supplies the steam,
    wherein the steam source introduces the steam into the chamber after the predetermined pressure is reached; and
    wherein the substrate is arranged in the chamber after a predetermined period corresponding to a desired partial pressure of steam.

6. The processing system of claim 1, further comprising:

a diluent gas source to supply diluent gas while the steam source supplies the steam, and wherein the diluent gas source adjusts a flow of the diluent gas and the steam source adjusts a flow of the steam to achieve a desired partial pressure of steam.

7. The processing system of claim 1, further comprising:

a pedestal; and a heater to heat the pedestal in the chamber during the predetermined conversion period.

8. The processing system of claim 7, wherein the heater heats the pedestal such that a temperature of the substrate is less than 480° C.

9. The processing system of claim 1, wherein a density of the substrate is increased after the predetermined conversion period.

10. The processing system of claim 9, further comprising:

an ammonia source to supply ammonia in one of the chamber and another chamber, wherein the density of the substrate is increased by directing the UV light onto the deposited layer for a predetermined densification period in the presence of the ammonia.

11. The processing system of claim 9, further comprising:

a diluent gas source supplying diluent gas in one of the chamber and another chamber, wherein the density of the substrate is increased by directing UV light onto the deposited layer for a predetermined densification period in the diluent gas.

12. The processing system of claim 9, wherein the substrate is annealed to increase the density of the substrate.

13. The processing system of claim 1, wherein the UV source provides broadband UV light.

14. The processing system of claim 5, wherein the diluent gas comprises oxygen.

15. The processing system of claim 6, wherein the diluent gas comprises oxygen.

16. The processing system of claim 11, wherein the diluent gas comprises oxygen.

* * * * *